（12）United States Patent
Saito et al.

(10) Patent No.: US 9,800,264 B2
(45) Date of Patent: Oct. 24, 2017

(54) TRANSMISSION DEVICE AND QUANTIZATION METHOD

(71) Applicant: Panasonic Corporation, Osaka (JP)

(72) Inventors: Akihiro Saito, Kanagawa (JP);
Tomohiro Kimura, Osaka (JP);
Toshiaki Sakurai, Kanagawa (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 15/501,781

(22) PCT Filed: Jun. 26, 2015

(86) PCT No.: PCT/JP2015/003216
§ 371 (c)(1),
(2) Date: Feb. 3, 2017

(87) PCT Pub. No.: WO2016/142971
PCT Pub. Date: Sep. 15, 2016

(65) Prior Publication Data
US 2017/0230057 A1    Aug. 10, 2017

(30) Foreign Application Priority Data
Mar. 9, 2015 (JP) ................................. 2015-046053

(51) Int. Cl.
H03M 7/30 (2006.01)
H04B 1/04 (2006.01)

(52) U.S. Cl.
CPC ................ H03M 7/30 (2013.01); H04B 1/04 (2013.01)

(58) Field of Classification Search
CPC ............ H03M 7/30; H03M 1/04; H03M 3/50; H03M 1/12; H03M 3/412; G10L 19/0208
(Continued)

(56) References Cited

U.S. PATENT DOCUMENTS 7,508,333 B2    3/2009 Kim et al.
7,688,245 B2    3/2010 Mueck
(Continued)

FOREIGN PATENT DOCUMENTS

JP    2009-532734 A    9/2009
JP    2010-022002 A    1/2010
WO    2007/114546 A1    10/2007

OTHER PUBLICATIONS

ETSI GS ORI 001 V4.1.1, "Open Radio equipment Interface (ORI); Requirements for Open Radio equipment Interface (ORI) (Release 4)," Group Specification, Oct. 2014, 16 pages.
(Continued)

Primary Examiner — Jean B Jeanglaude
(74) Attorney, Agent, or Firm — Seed IP Law Group LLP

(57) ABSTRACT

Disclosed is a transmission device capable of reducing quantization errors in nonlinear quantization of IQ signals. In the device, a standard deviation measuring unit measures a standard deviation σ of the amplitude distribution of input signals. A kurtosis measuring unit measures the kurtosis of the amplitude distribution of the input signals. A correction coefficient determining unit determines a correction coefficient α corresponding to the kurtosis of the amplitude distribution of the input signals. A quantization unit quantizes the input signals using the correction coefficient α and calculates quantization data. A multiplexing unit multiplexes the quantization data and quantization control information with each other.

16 Claims, 15 Drawing Sheets

(58) Field of Classification Search
USPC .......................................... 341/143, 155, 200
See application file for complete search history.

(56) References Cited

U.S. PATENT DOCUMENTS

| | | |
|---|---|---|
| 2007/0229345 A1 | 10/2007 | Kim et al. |
| 2010/0007543 A1 | 1/2010 | Mueck |
| 2013/0132100 A1* | 5/2013 | Sung .................. G10L 19/0208 |
| | | 704/501 |

OTHER PUBLICATIONS

ETSI GS ORI 002-1 V4.1.1, "Open Radio equipment Interface (ORI); ORI interface Specification; Part 1: Low Layers (Release 4)," Group Specification, Oct. 2014, 25 pages.
ETSI GS ORI 002-2 V4.1.1, "Open Radio equipment Interface (ORI); ORI Interface Specification; Part 2: Control and Management (Release 4)," Group Specification, Oct. 2014, 185 pages.
International Search Report dated Sep. 8, 2015, for corresponding International Application No. PCT/JP2015/003216, 4 pages.

* cited by examiner

TRANSMISSION DEVICE AND QUANTIZATION METHOD

TECHNICAL FIELD

The present disclosure relates to a transmission apparatus and a quantization method.

BACKGROUND ART

For interfaces complying with ORI (Open Radio equipment Interface) which is an international standard, data compression techniques have been studied for the purpose of reducing the transfer rate of the IQ signal between the REC (Radio Equipment Control) and the RE (Radio Equipment) (see, for example, Non-PTLS 1 to 3).

Data compression techniques of the IQ signal include down-sampling (reduction of sampling rate), and non-linear quantization (reduction of transmission bit number).

By utilizing the characteristics in which the distribution of the signal amplitude of the real part and the imaginary part (hereinafter referred to as IQ) is a regular distribution (see, for example, FIG. 1(a)), the non-linear quantization employs an algorithm for reducing the transmission bit number of each sample by use of the cumulative distribution function (CDF) of the amplitude of the IQ signal (see, for example, FIG. 1(b)). To be more specific, in non-linear quantization, the quantization threshold is set such that the sample value corresponding to the amplitude having a higher occurrence probability is more correctly indicated (the quantization error is reduced) in comparison with the sample value corresponding to the amplitude having a lower occurrence probability in consideration of the frequency of generation (occurrence probability) of the amplitude of the input signal. That is, in the amplitude distribution of the IQ signal, the interval of the quantization threshold of the amplitude having a high occurrence probability (the amplitudes around the average value) is set to a value smaller than the interval of the quantization threshold of the amplitude having a low occurrence probability (see, for example, FIG. 1(c)).

Cumulative distribution function g(x) of the regular distribution can be expressed with error function (erf) as in Expression (1).

[Expression 1]

$$g(x) = \frac{1}{2}\left(1 + erf\left(\frac{x}{\sqrt{2}\sigma}\right)\right) \quad (1)$$

In Expression (1), x is an integer value representing the IQ signal for compression (that is, the input signal), which falls within the range of $[-2^{N-1}, \ldots, 2^{N-1}-1]$ (N is a natural number). For example, a sample value of input signal x is represented by N=15 bits, for example. In addition, σ represents a standard deviation.

Next, the value of function g(x) expressed by Expression (1) is associated with sample value h(x) (that is, quantization data) of the IQ signal after compression in accordance with Expression (2).

[Expression 2]

$$h(x) = |g(x) * (2^M - 1)| \quad (2)$$

In Expression (2), h(x) is an integer value representing quantization data, which falls within the range of $[0, \ldots, 2^{M-1}]$ (M is a natural number smaller than N). The sample value of the quantization data is represented by M=10 bits, for example. In addition, the right side of Expression (2) is a minimum integer of $g(x) * (2^{M-1})$ or greater.

That is, in the above-mentioned example, the input signal of N=15 bits is compressed into quantization data of M=10 bits by non-linear quantization.

CITATION LIST

Non-PTLs

Non-PTL 1
ETSI GS ORI 001 V4.1.1 (2014-10)
Non-PTL 2
ETSI GS ORI 002-1 V4.1.1 (2014-10)
Non-PTL 3
ETSI GS ORI 002-2 V4.1.1 (2014-10)

SUMMARY OF INVENTION

Technical Problem

In the case where the amplitude distribution of the IQ signal varies, however, the amplitude distribution of the IQ signal may possibly not be a regular distribution. In this case, with the above-described non-linear quantization, the quantization error may possibly be increased.

An object of the present disclosure is to provide a transmission apparatus and a quantization method which can reduce quantization error in non-linear quantization of an IQ signal.

Solution to Problem

A transmission apparatus according to a mode of the present disclosure includes: a kurtosis measurement section that measures a degree of kurtosis of an amplitude distribution of an input signal; a determination section that determines correction coefficient α in accordance with the degree of kurtosis; and a quantization section that quantizes the input signal and calculates quantization data by use of the correction coefficient α in accordance with Expression (2) and Expression (3).

A transmission apparatus according to a mode of the present disclosure includes: a skewness measurement section that measures a degree of skewness of an amplitude distribution of an input signal; a determination section that determines correction coefficient β in accordance with the degree of skewness; and a quantization section that quantizes the input signal and calculates quantization data by use of the correction coefficient β in accordance with Expression (2) and Expression (4).

A transmission apparatus according to a mode of the present disclosure includes: a kurtosis measurement section that measures a degree of kurtosis of an amplitude distribution of an input signal; a skewness measurement section that measures a degree of skewness of the amplitude distribution of the input signal; a determination section that determines correction coefficient α in accordance with the degree of kurtosis and determines correction coefficient β in accordance with the degree of skewness; and a quantization section that quantizes the input signal and calculates quantization data by use of the correction coefficient α and the correction coefficient β in accordance with Expression (2) and Expression (5).

A quantization method according to a mode of the present disclosure includes: measuring a degree of kurtosis of an amplitude distribution of an input signal; determining correction coefficient α in accordance with the degree of kurtosis; and quantizing the input signal and calculating quantization data by use of the correction coefficient α in accordance with Expression (2) and Expression (3).

A quantization method according to a mode of the present disclosure includes: measuring a degree of skewness of an amplitude distribution of an input signal; determining correction coefficient β in accordance with the degree of skewness; and quantizing the input signal and calculating quantization data by use of the correction coefficient β in accordance with Expression (2) and Expression (4).

A quantization method according to a mode of the present disclosure includes: measuring a degree of kurtosis of an amplitude distribution of an input signal; measuring a degree of skewness of the amplitude distribution of the input signal; determining correction coefficient α in accordance with the degree of kurtosis and determining correction coefficient β in accordance with the degree of skewness; and quantizing the input signal and calculating quantization data by use of the correction coefficient α and the correction coefficient β in accordance with Expression (2) and Expression (5).

Advantageous Effects of Invention

According to embodiments of the present disclosure, quantization error in non-linear quantization of an IQ signal can be reduced.

DESCRIPTION OF EMBODIMENTS

Embodiments of the present disclosure are described in detail below with reference to the accompanying drawings.
(Embodiment 1)
[Configuration of Communication System]

Figure 1:
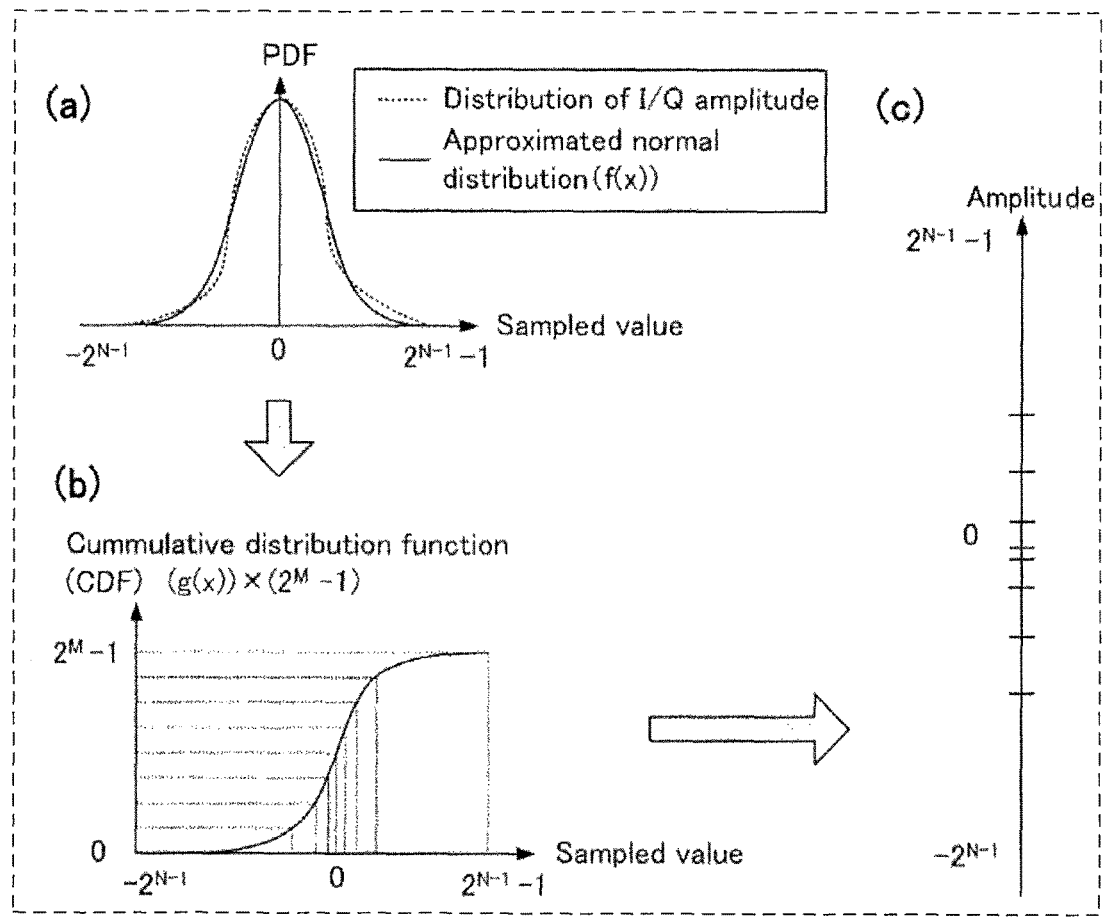
FIG. 1 illustrates examples of (a) a distribution of an IQ signal, (b) a cumulative distribution function, and (c) a quantization threshold in a non-linear quantization process of ORI.
Figure 2:
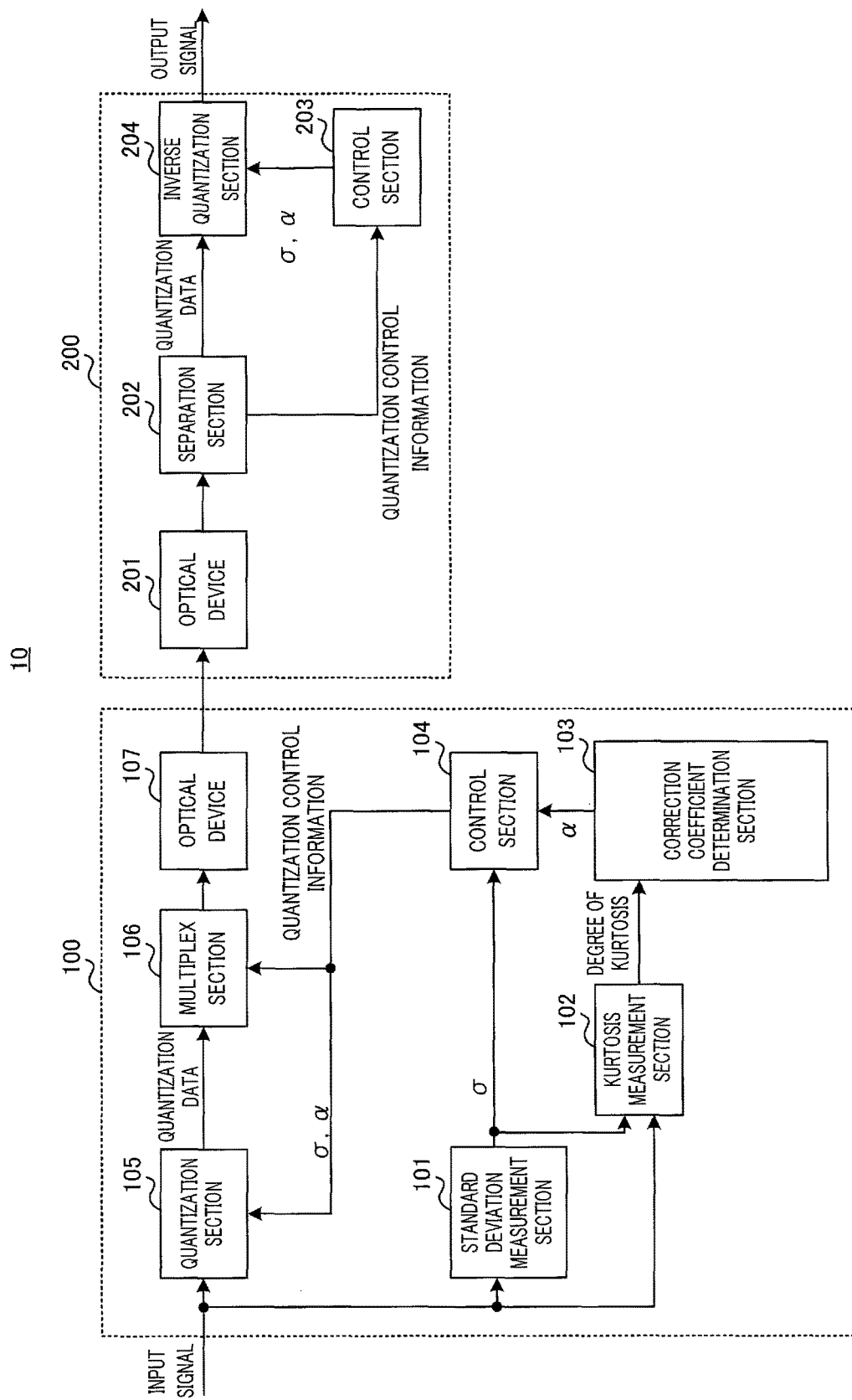
FIG. 2 is a block diagram illustrating an example configuration of a communication system according to Embodiment 1.

FIG. 2 illustrates an example configuration of a communication system according to the present embodiment.

Communication system 10 illustrated in FIG. 2 includes transmission apparatus 100 and reception apparatus 200.

Transmission apparatus 100 performs non-linear quantization on an input signal (IQ signal), and transmits the quantization data to reception apparatus 200 through an optical line. Transmission apparatus 100 is an REC, and is a BBU (Base Band Unit), for example. Further, transmission apparatus 100 may convert (down-sampling) the data rate of an input signal (which is not illustrated in the drawing).

Reception apparatus 200 performs inverse quantization on quantization data transmitted from transmission apparatus 100, and obtains a signal (output signal) after the inverse quantization. Reception apparatus 200 is an RE and is an RRH (Remote Radio Head), for example. Further, reception apparatus 200 may convert (up sampling) the data rate of the received signal (which is not illustrated in the drawing).
[Configuration of Transmission Apparatus 100]

Transmission apparatus 100 includes standard deviation measurement section 101, kurtosis measurement section 102, correction coefficient determination section 103, control section 104, quantization section 105, multiplex section 106, and optical device 107.

Standard deviation measurement section 101 measures standard deviation σ of an input signal, and outputs the measured standard deviation σ to kurtosis measurement section 102 and control section 104.

Kurtosis measurement section 102 uses an input signal, and standard deviation σ input from standard deviation measurement section 101 to measure the "degree of kurtosis" which represents the degree of concentration of the amplitude distribution of the input signal. Kurtosis measurement section 102 outputs information representing the measured degree of kurtosis to correction coefficient determination section 103.

Figure 3:
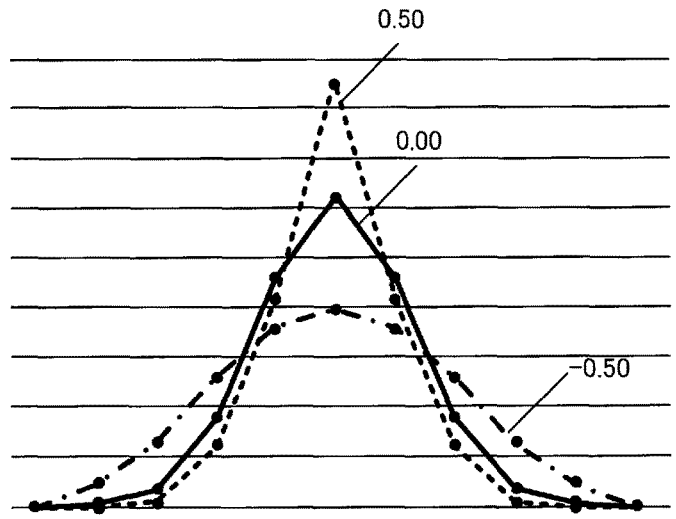
FIG. 3 is used for describing the degree of kurtosis.

FIG. 3 is used for describing the characteristics of the degree of kurtosis. As illustrated in FIG. 3, when the amplitude distribution of an input signal is a regular distribution, the degree of kurtosis is 0. In addition, as illustrated in FIG. 3, in the amplitude distribution of an input signal, the degree of kurtosis has a large value (in FIG. 3, 0.5) on the positive side when the degree of concentration around the average value is high relative to the regular distribution, and the degree of kurtosis has a large value (in FIG. 3, −0.5) on the negative side when the degree of concentration around the average value is low relative to the regular distribution.

Correction coefficient determination section 103 determines correction coefficient (Scaling Factor) α of a cumulative distribution function which is used for the non-linear quantization in accordance with the degree of kurtosis represented by the information input from kurtosis measurement section 102. Correction coefficient determination section 103 outputs the determined correction coefficient α to control section 104.

Correction coefficient determination section 103 preliminarily holds the relationship (kurtosis table) of the value of the degree of kurtosis and the value of correction coefficient α. For example, in the kurtosis table representing the relationship of the value of the degree of kurtosis and the value of correction coefficient α, correction coefficient determination section 103 preliminarily sets correction coefficient α of the case where the degree of kurtosis is 0 (the case of the regular distribution) as the reference value. The reference value of correction coefficient α is determined by a calculation simulation and the like (details will be described later), for example. The value of the degree of kurtosis and the value of correction coefficient α are associated in the kurtosis table such that, as the degree of kurtosis increases to the positive side (degree of kurtosis>0), correction coefficient α decreases in a range smaller than the reference value, and that, as the degree of kurtosis increases to the negative side (degree of kurtosis<0), correction coefficient α increases in a range greater than the reference value (see, for example, FIG. 4).

Control section 104 generates quantization control information including a input from standard deviation measurement section 101 and correction coefficient α input from correction coefficient determination section 103, and outputs the quantization control information to quantization section 105 and multiplex section 106.

By use of the quantization control information (σ, α) input from control section 104, quantization section 105 performs the non-linear quantization on the input signal, and calculates quantization data. Quantization section 105 outputs the calculated quantization data to multiplex section 106. To be more specific, quantization section 105 performs the non-linear quantization on the input signal in accordance with cumulative distribution function g(x) expressed by Expression (3), and Expression (2). Expression (3) differs from Expression (1) in that correction coefficient α is additionally provided.

[Expression 3]

$$g(x) = \frac{1}{2}\left(1 + erf\left(\frac{x}{\sqrt{2}\,\sigma*\alpha}\right)\right) \quad (3)$$

Multiplex section 106 multiplexes the quantization data input from quantization section 105 with the quantization control information input from control section 104 to generate a multiplex signal. Multiplex section 106 outputs the generated multiplex signal to optical device 107.

Optical device 107 transmits the multiplex signal input from multiplex section 106 to reception apparatus 200 through an optical line.

It is to be noted that the quantization control information (σ, α) may be notified simultaneously with the quantization data, or may be preliminarily notified to reception apparatus 200 before the non-linear quantization/inverse quantization.

In addition, transmission apparatus 100 may notify the quantization control information (updated σ or α) to reception apparatus 200 every time when standard deviation σ or correction coefficient α is updated. Details of the way of the notification of the quantization control information will be described later.

[Configuration of Reception Apparatus 200]

Reception apparatus 200 includes optical device 201, separation section 202, control section 203, and inverse quantization section 204.

Optical device 201 receives through an optical line a signal transmitted from transmission apparatus 100, and outputs the received signal to separation section 202. The received signal contains quantization data or quantization control information.

Separation section 202 separates the received signal input from optical device 201 into quantization data and quantization control information, and outputs the quantization control information and the quantization data to control section 203 and inverse quantization section 204, respectively.

Control section 203 extracts a parameter which is used for the non-linear inverse quantization from the quantization control information input from separation section 202. The parameter used for the non-linear inverse quantization includes standard deviation σ and correction coefficient α. Control section 203 outputs standard deviation σ and correction coefficient α to inverse quantization section 204.

By use of the parameters (σ, α) input from control section 203, inverse quantization section 204 performs the non-linear inverse quantization on the quantization data input from separation section 202. That is, by use of the non-linear quantization data and the notification parameter in quantization section 105 of transmission apparatus 100, inverse quantization section 204 performs restoration of the IQ signal, and outputs the obtained signal.

[Way of Setting Correction Coefficient α]

Next, details of the way of setting correction coefficient α used in transmission apparatus 100 and reception apparatus 200 are described.

First, setting of the reference value of correction coefficient α, that is, correction coefficient α for the case where the amplitude distribution of the input signal is the regular distribution (degree of kurtosis: 0) is described.

Figure 5C:
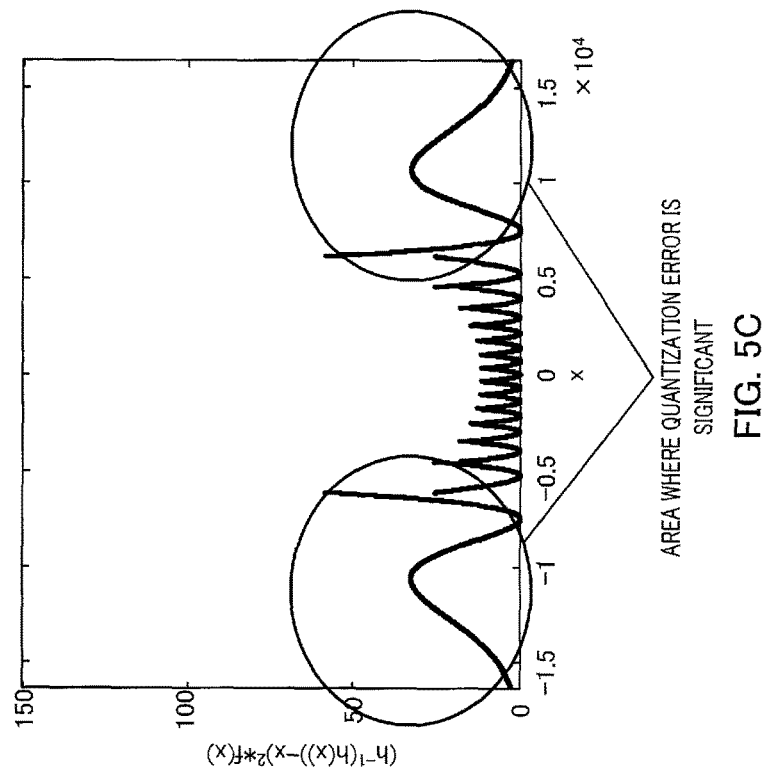
FIG. 5C illustrates a quantization error in the case where the amplitude distribution of the input signal is the regular distribution.
Figure 5A:
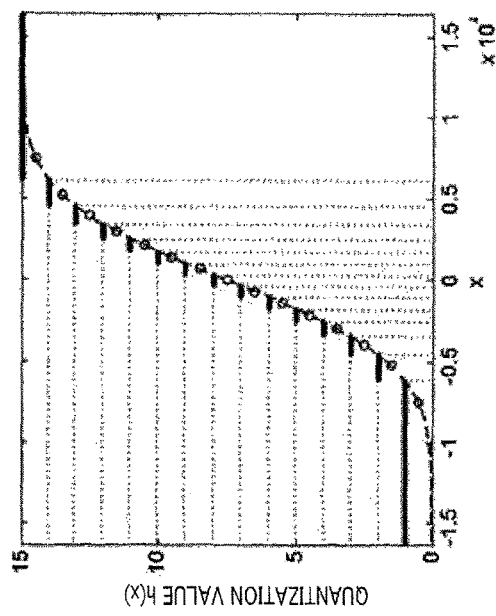
FIG. 5A illustrates a relationship between input signal x and quantization value h(x)
Figure 5B:
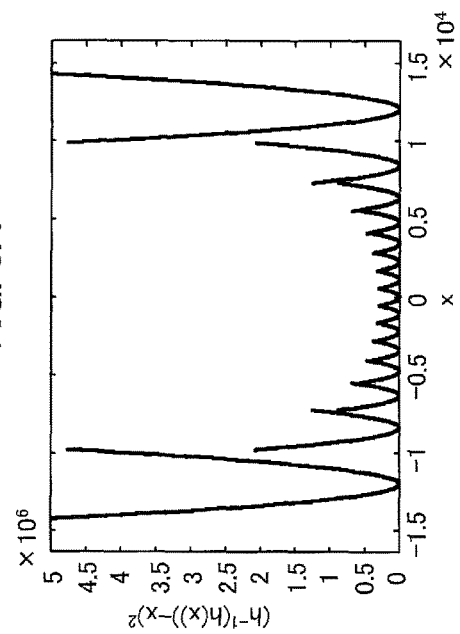
FIG. 5B illustrates a squared error of an intermediate value of input signal x and quantization value h(x)

FIG. 5A to FIG. 5C are used for describing an quantization error in the case where correction coefficient α is not used (which corresponds to correction coefficient α=1).

FIG. 5A illustrates a relationship (the thick solid line in the drawing) between input signal x and quantization value h(x) which is obtained in accordance with Expression (1) and Expression (2) (note that M=4 bits). The setting interval of the quantization threshold is shortened as the generation frequency of input signal x increases, and the setting interval of the quantization threshold is widened as the generation frequency of input signal x decreases. In this manner, probability of the generation is substantially uniformized among the values of quantization value h(x).

Each of the markers (the circles in the drawing) illustrated in FIG. 5A represents a point on Expression (1) corresponding to the intermediate value of adjacent quantization values h(x), and the projection of the markers to input signal x represents a representative value of each quantization zone. The non-linear inverse quantization is conversion of quantization value h(x) to the representative value of the quantization zone represented by the quantization value h(x).

FIG. 5B illustrates the squared error of input signal x and the representative value of the quantization zone corresponding to the input signal x in the case where the non-linear quantization having the characteristics illustrated in FIG. 5A is performed. That is, FIG. 5B illustrates the square of the error caused by performing the non-linear quantization and the non-linear inverse quantization on input signal x (which is hereinafter referred to as "quantization error"). As illustrated in FIG. 5B, the quantization error is increased as the quantization zone is widened.

FIG. 5C illustrates a result obtained by multiplying the squared error of input signal x and the representative value of the quantization zone corresponding to the input signal x, by the occurrence probability (generation frequency) of the input signal x in the case where the occurrence probability of input signal x is the regular distribution and the non-linear quantization having the characteristics illustrated in FIG. 5A is performed. That is, FIG. 5C illustrates a result obtained by multiplying the quantization error by the occurrence probability (generation frequency) of the input signal x (hereinafter referred to as "weighted quantization error"). The weighted quantization error integrated with respect to input signal x represents the average quantization error.

As illustrated in FIG. 5C, even after the assignment of weights of the occurrence probability of the input signal x, the weighted quantization error of the region where the quantization zone is wide has a large value, and the average quantization error is large. As a way for reducing the average quantization error, it is conceivable to optimally set the quantization threshold such that the weighted quantization error in each quantization zone is small. However, under an environment where the occurrence probability (generation frequency) of the input signal varies, it is extremely difficult to perform real-time optimization of the quantization threshold.

In view of this, in the present embodiment, transmission apparatus 100 and reception apparatus 200 correct the characteristics of cumulative distribution function g(x) used for the non-linear quantization by use of correction coefficient α.

Figure 6:
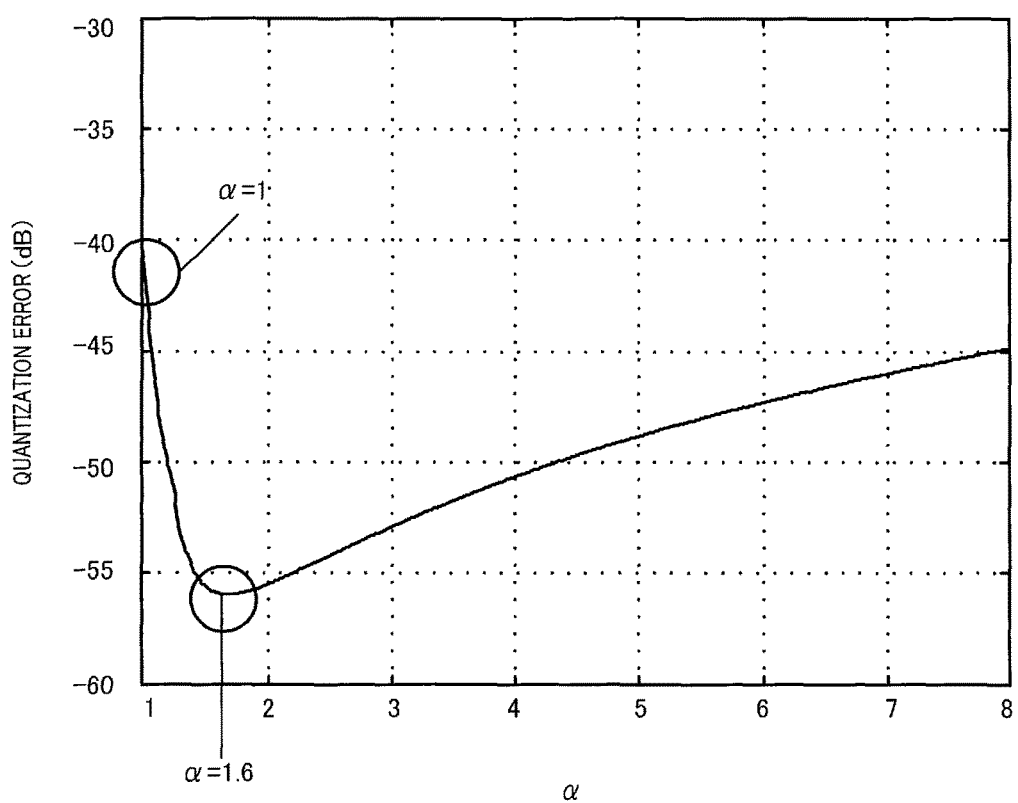
FIG. 6 illustrates an optimum value of correction coefficient α of the case where the amplitude distribution of the input signal is the regular distribution according to Embodiment 1.

FIG. 6 illustrates a result of a calculator simulation conducted by the present inventors, which shows a relationship between the quantization error and the value of correction coefficient α in cumulative distribution function g(x) expressed by Expression (3) in the case where the amplitude distribution of the input signal is the regular distribution. In FIG. 6, the number of bits M after quantization is 10 as with the ORI.

As illustrated in FIG. 6, in the area around correction coefficient α=1.6, the average quantization error is minimized (about −56 dB). In contrast, in the case of correction coefficient α=1 (that is, in the case of no correction, which corresponds to the ORI), the average quantization error is about −41 dB.

That is, in the case where the input signal is the regular distribution, the quantization error in the non-linear quantization average can be minimized by setting α of cumulative distribution function g(x) expressed by Expression (3) to 1.6.

Figure 7:
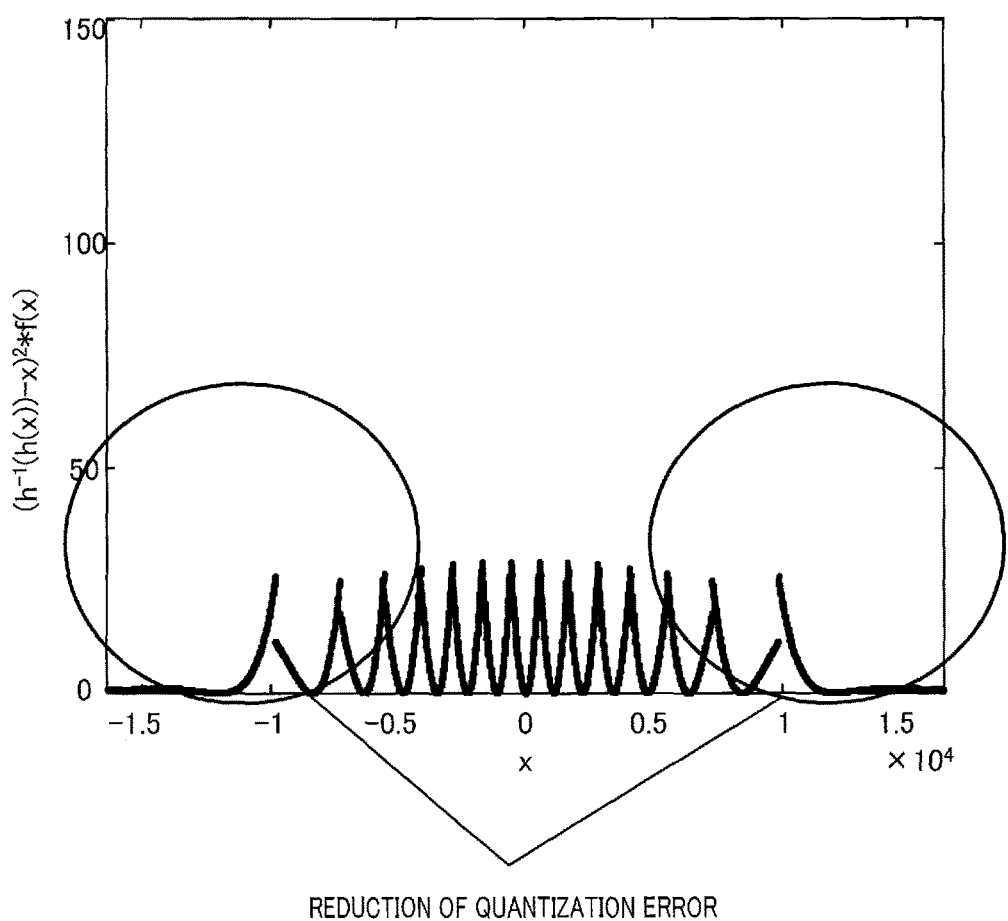
FIG. 7 is used for describing reduction of quantization error with correction coefficient α according to Embodiment 1.

FIG. 7 illustrates the weighted quantization error obtained by multiplying, by the occurrence probability of the input signal (note that M=4 bits), the squared error of input signal x and quantization value h(x) of the case where the non-linear quantization is performed in accordance with Expression (3) with a correction coefficient α of 1.6 when the input signal is the regular distribution.

In comparison with FIG. 5C (the case of no correction), in FIG. 7, the weighted quantization error in the region where the generation frequency of input signal x is high is slightly high, but the weighted quantization error is reduced as a whole including the region where the generation frequency of input signal x is low.

That is, it can be said that the average quantization error can be further reduced by appropriately setting correction coefficient α and by performing the non-linear quantization in accordance with Expression (3) (with correction), in comparison with the case where the non-linear quantization is performed in accordance with Expression (1) (no correction).

It is to be noted that correction coefficient α=1.6 illustrated in FIG. 6 is an optimum value which is obtained under the condition assumed in the above-mentioned calculator simulation, and the optimum value of correction coefficient α of the case where the amplitude distribution of the input signal is the regular distribution is not limited to 1.6. The optimum value of correction coefficient α of the case where the amplitude distribution of the input signal is the regular distribution may be appropriately set in accordance with the conditions.

The following describes the way of setting correction coefficient α in accordance with the degree of kurtosis of the amplitude distribution of the input signal by use of correction coefficient α in the case where the amplitude distribution of the input signal is the regular distribution as the reference value.

As illustrated in FIG. 3, as the degree of kurtosis of the amplitude distribution of the input signal increases, the degree of concentration at the average value of the amplitude distribution increases and the distribution around the average value becomes steep. On the other hand, as illustrated in FIG. 3, as the degree of kurtosis of the amplitude distribution of the input signal decreases, the degree of concentration at the average value of the amplitude distribution decreases and the distribution around the average value becomes gradual.

On the other hand, as expressed in Expression (3), correction coefficient α is a parameter by which standard deviation σ as the denominator of the error function (erf) corresponding to the cumulative distribution function of the regular distribution is multiplied. That is, the distribution in cumulative distribution function g(x) expressed by Expression (3) becomes gradual in the case of correction coefficient α>1, and the distribution in cumulative distribution function g(x) expressed by Expression (3) becomes steep in the case of correction coefficient α<1.

That is, correction coefficient α serves to adjust the degree of variation of the distribution in cumulative distribution function g(x). In other words, correction coefficient α serves to adjust the setting interval (quantization zone) of the quantization threshold in the non-linear quantization and the representative value of each quantization zone in the non-linear inverse quantization. To be more specific, the setting interval of the quantization threshold increases as correction coefficient α increases in the range greater than 1, and the setting interval of the quantization threshold decreases as correction coefficient α decreases in the range smaller than 1.

Figure 4:
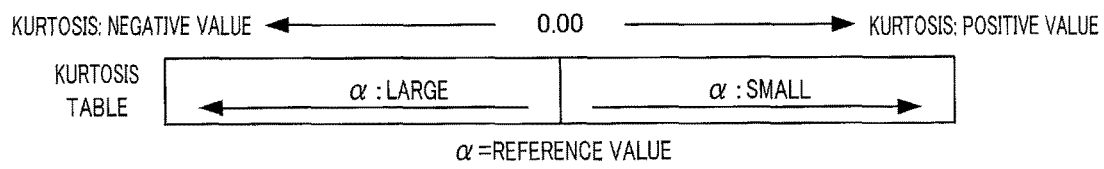
FIG. 4 illustrates an example kurtosis table according to Embodiment 1.
Figure 8:
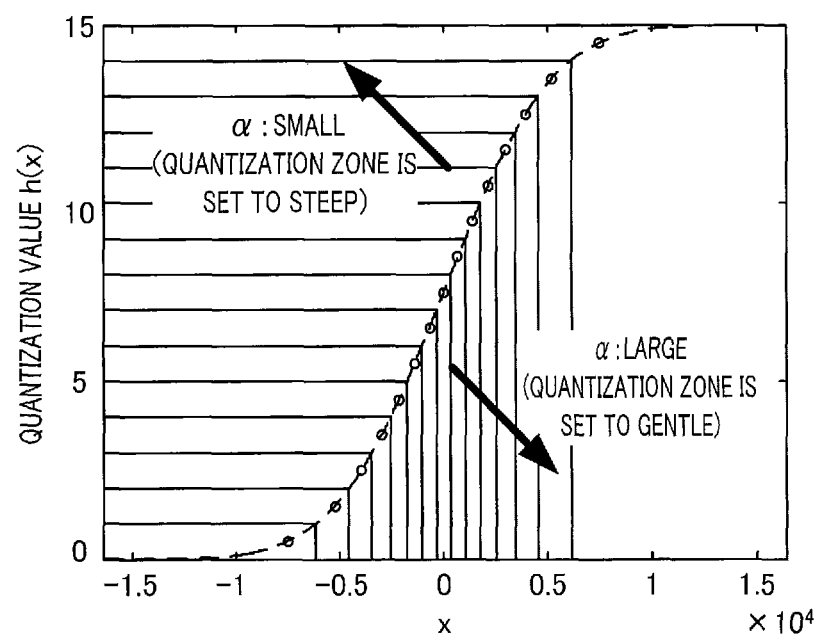
FIG. 8 is used for describing adjustment of a quantization zone with correction coefficient α according to Embodiment 1.

In view of this, as illustrated in FIG. 4, correction coefficient determination section 103 sets the value of correction coefficient α such that the value decreases relative to the reference value as the degree of kurtosis of the amplitude distribution of the input signal increases. In this manner, as illustrated in FIG. 8, quantization section 105 performs non-linear quantization in which the setting interval of the quantization threshold is narrow (the quantization zone is set to steep).

On the other hand, as illustrated in FIG. 4, correction coefficient determination section 103 sets the value of correction coefficient α such that the value increases relative to the reference value as the degree of kurtosis of the amplitude distribution of the input signal decreased. In this manner, as illustrated in FIG. 8, quantization section 105 performs non-linear quantization in which the setting interval of the quantization threshold is wide (the quantization zone is set to gradual).

As described, transmission apparatus 100 appropriately adjust the interval of the quantization threshold in the non-linear quantization in accordance with the amplitude distribution of the input signal. In this manner, even in the case where the occurrence probability of the input signal varies, non-linear quantization (non-linear inverse quantization) using the quantization threshold in accordance with the amplitude distribution of the input signal is performed, and thus the quantization error can be reduced.

[Notification of Correction Coefficient α]

Next, details of notification of quantization control information from transmission apparatus 100 (REC) to reception apparatus 200 (RE) are described.

Figure 9:
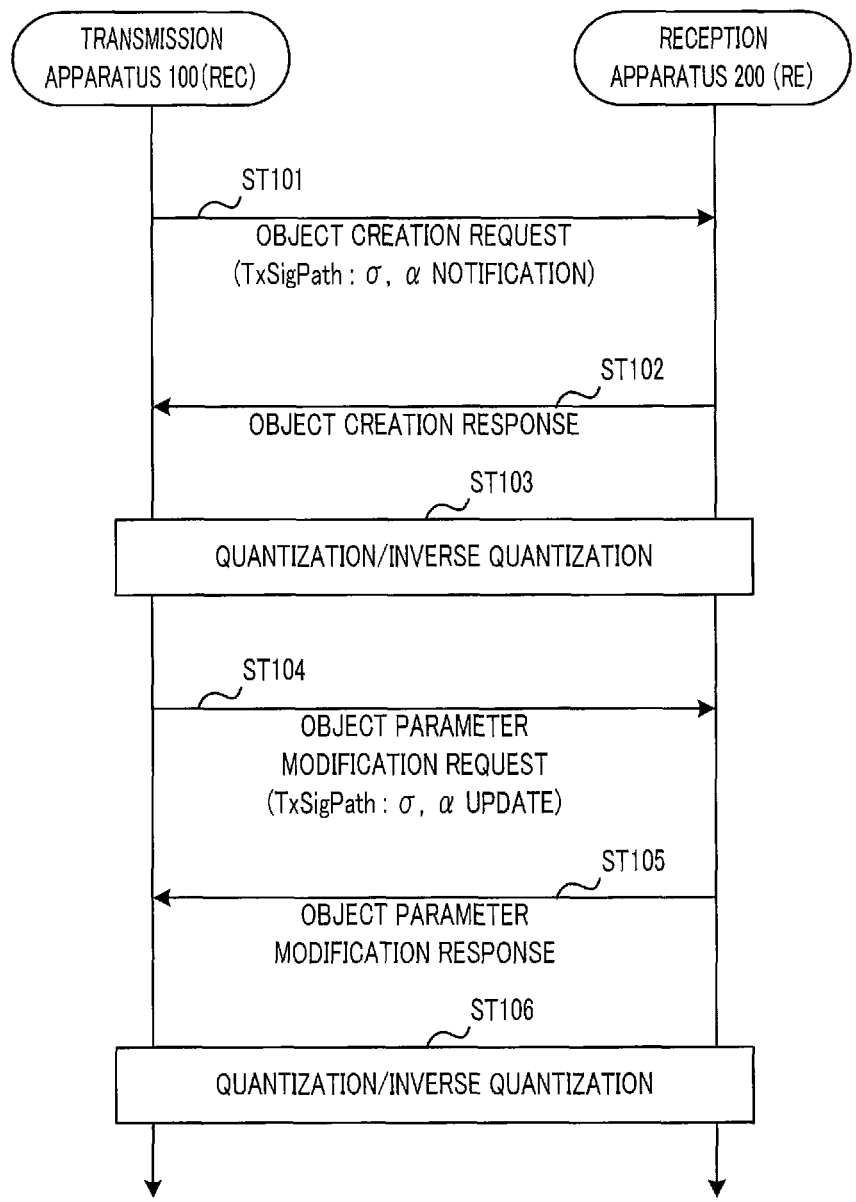
FIG. 9 is a sequence diagram illustrating a notification operation of correction coefficient α according to Embodiment 1.

FIG. 9 is a sequence diagram illustrating an operation of exchanging signals of transmission apparatus 100 and reception apparatus 200.

In FIG. 9, at step (hereinafter referred to simply as "ST") 101, transmission apparatus 100 transmits quantization control information including standard deviation σ and correction coefficient α used for the non-linear quantization to reception apparatus 200.

For example, in C&M (Control and Management) of ORI, OBJECT CREATION REQUEST message is used for parameter notification from the REC (which corresponds to transmission apparatus 100) to the RE (reception apparatus 200). In addition, in ORI, standard deviation σ used for the non-linear quantization (that is, data compression) is notified in the field represented by TxSigPath object in OBJECT CREATION REQUEST message.

In view of this, transmission apparatus 100 may notify standard deviation σ and correction coefficient α by use of TxSigPath object, for example. That is, correction coefficient α is notified to reception apparatus 200 as a parameter of TxSigPath object of C&M of ORI.

At ST102, in response to reception of an OBJECT CREATION REQUEST message including quantization control information at ST101, reception apparatus 200 generates an OBJECT CREATION RESPONSE message, and transmits the OBJECT CREATION RESPONSE message to transmission apparatus 100. The response includes information on whether success or failure of the reception of the quantization control information and the like, for example.

When success of the reception of the quantization control information is indicated in the OBJECT CREATION RESPONSE message at ST102, transmission apparatus 100 and reception apparatus 200 perform, at ST103, non-linear quantization and non-linear inverse quantization by use of the standard deviation σ and the correction coefficient α notified at ST101.

Thereafter, when the amplitude distribution of the input signal in transmission apparatus 100 is varied and the standard deviation σ or the correction coefficient α is updated, transmission apparatus 100 transmits quantization control information including the updated standard deviation σ or correction coefficient α to reception apparatus 200 at ST104.

For example, in ORI, OBJECT PARAMETER MODIFICATION REQUEST message is used for notification of the parameter update from the REC (which corresponds to transmission apparatus 100) to the RE (reception apparatus 200). In addition, in C&M of ORI, updated standard deviation σ is notified in the field represented by TxSigPath object in the message.

In view of this, transmission apparatus 100 may notify updated standard deviation σ or correction coefficient α by use of TxSigPath object, for example.

At ST105, in response to reception of an OBJECT PARAMETER MODIFICATION REQUEST message including quantization control information at ST104, reception apparatus 200 generates an OBJECT PARAMETER MODIFICATION RESPONSE message, and transmits the OBJECT PARAMETER MODIFICATION RESPONSE message to transmission apparatus 100. The response includes information on whether success or failure of the reception of the quantization control information and the like, for example.

When success of reception of the quantization control information is indicated in the OBJECT PARAMETER MODIFICATION RESPONSE message at ST105, transmission apparatus 100 and reception apparatus 200 perform, at ST106, non-linear quantization and non-linear inverse quantization by use of the updated standard deviation σ or correction coefficient α notified at ST104.

As described, in FIG. 9, correction coefficient α is newly added in addition to the existing standard deviation σ in TxSigPath object of C&M of ORI.

It is to be noted that, as expressed in Expression (3), correction coefficient α is a parameter by which standard deviation σ is multiplied. In view of this, transmission apparatus 100 may notify a result (σ'=σ*α) obtained by multiplying standard deviation σ by correction coefficient α to reception apparatus 200 instead of individually notifying standard deviation σ and correction coefficient α as illustrated in FIG. 9. In this case, parameter σ' may be notified by use of the notification field corresponding to standard deviation σ of the existing notification field defined in C&M of ORI. With this configuration, it is unnecessary to newly define the notification field for correction coefficient α.

While the way of adjusting the quantization threshold and the representative value of each quantization zone with correction coefficient α has been described above, it is also possible to correct input signal x and the signal after the inverse quantization with correction coefficient α.

Hereinabove, the way of notifying the quantization control information has been described.

In the above-mentioned manner, in the present embodiment, transmission apparatus 100 determines correction coefficient α in accordance with the degree of kurtosis of the amplitude distribution of the IQ signal, and adjusts the interval of the quantization threshold in the non-linear quantization. In this manner, the quantization threshold is appropriately set in accordance with the variation of the amplitude distribution of the IQ signal, and thus the quantization error in the non-linear quantization can be reduced.

(Embodiment 2)

In Embodiment 1, the non-linear quantization is performed by use of the correction coefficient corresponding to the degree of kurtosis of the amplitude distribution of the input signal. In contrast, in the present embodiment, the non-linear quantization is performed by use of a correction coefficient corresponding to the degree of skewness of the amplitude distribution of the input signal.

[Configuration of Communication System]

Figure 10:
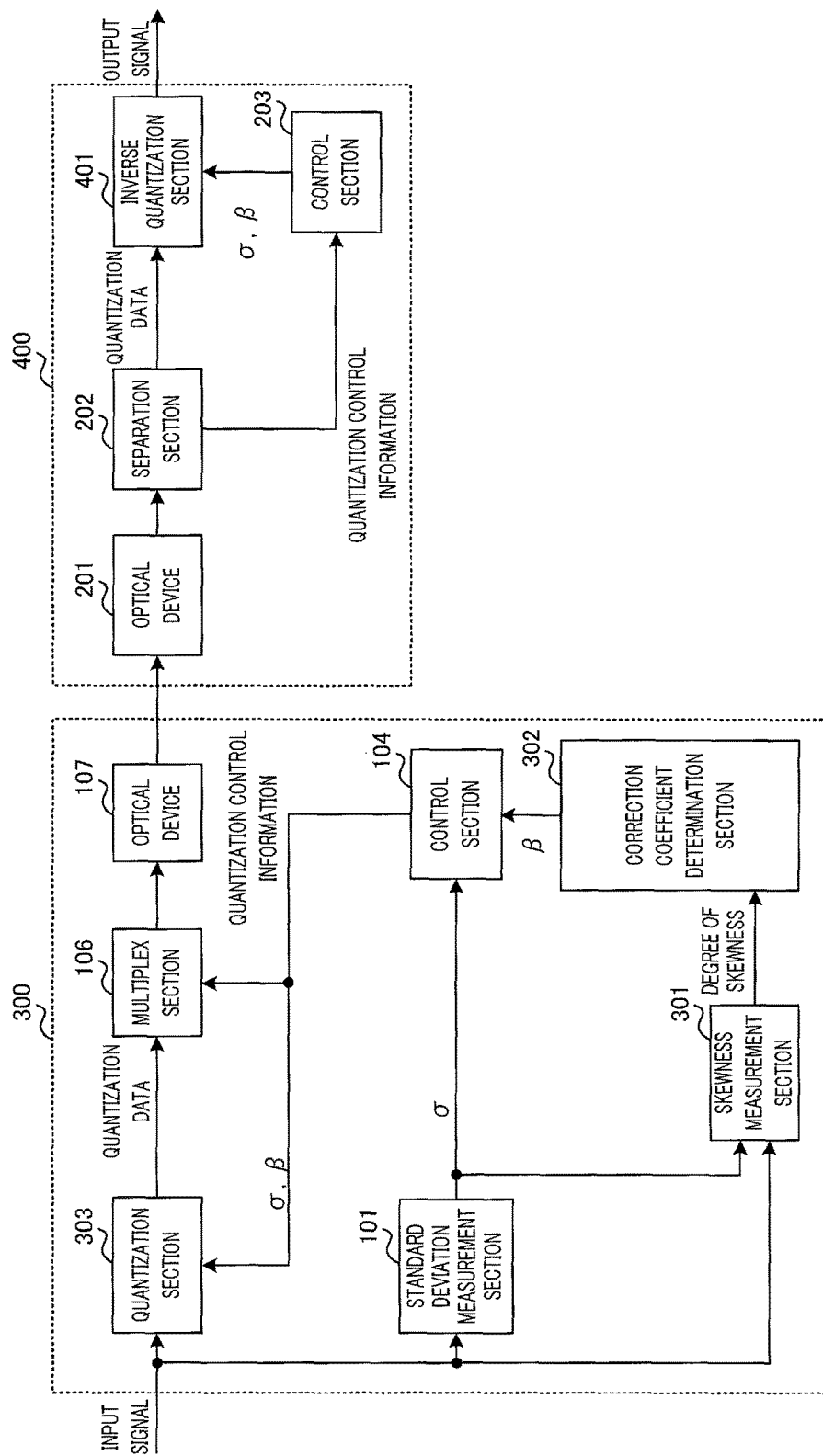
FIG. 10 is a block diagram illustrating an example configuration of a communication system according to Embodiment 2.

FIG. 10 illustrates an example configuration of a communication system according to the present embodiment.

Communication system 20 illustrated in FIG. 10 includes transmission apparatus 300 and reception apparatus 400. It is to be noted that, in FIG. 10, the components similar to those of Embodiment 1 (FIG. 2) are denoted with the same reference numerals, and the description thereof will be omitted. Transmission apparatus 300 includes skewness measurement section 301 in place of kurtosis measurement section 102 of transmission apparatus 100 (FIG. 2).

Skewness measurement section 301 of transmission apparatus 300 measures "degree of skewness" which indicates the bilateral symmetry in the amplitude distribution of the input signal by use of the input signal and standard deviation σ input from standard deviation measurement section 101. Skewness measurement section 301 outputs information representing the measured degree of skewness to correction coefficient determination section 302.

Figure 11:
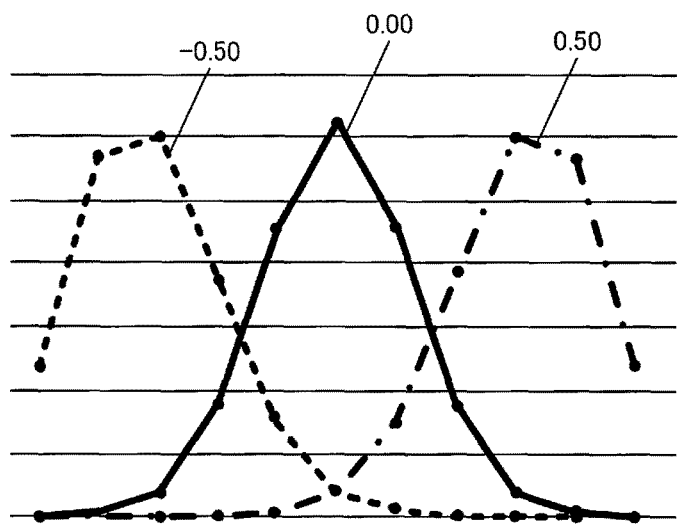
FIG. 11 is used for describing the degree of skewness.

FIG. 11 is used for describing characteristics of the degree of skewness. As illustrated in FIG. 11, when the amplitude distribution of the input signal is the regular distribution, the degree of skewness is 0. In addition, as illustrated in FIG. 11, in the amplitude distribution of the input signal, as deflection to the positive side relative to the regular distribution increases, the degree of skewness increases on the positive side (in FIG. 11, 0.5), and as deflection to the negative side relative to the regular distribution increases, the degree of skewness increases on the negative side (in FIG. 11, −0.5).

Correction coefficient determination section 302 determines correction coefficient β of the cumulative distribution function used for the non-linear quantization in accordance with the degree of skewness indicated in information input from skewness measurement section 301. Correction coefficient determination section 302 outputs the determined correction coefficient β to control section 104.

Correction coefficient determination section 302 preliminarily holds the relationship (skewness table) of the degree of skewness and the value of correction coefficient β. For example, in the skewness table, correction coefficient β is set to 0 (that is, no correction) when the degree of skewness is 0 (in the case of a regular distribution). The degree of skewness and the value of correction coefficient β are associated in the skewness table such that the correction coefficient β increases to the positive side as the degree of skewness increases to the positive side (degree of skewness>0), and that the correction coefficient β increases to the negative side as the degree of skewness increases to the negative side (degree of skewness<0) (see, for example, FIG. 12).

The quantization control information output from control section 104 includes standard deviation σ and correction coefficient β.

By use of the quantization control information (σ, β) input from control section 104, quantization section 303 performs the non-linear quantization on the input signal, and calculates quantization data. To be more specific, quantization section 303 performs the non-linear quantization on the input signal in accordance with cumulative distribution function g(x) expressed by Expression (4), and Expression (2). Expression (4) differs from Expression (1) in that correction coefficient β is additionally provided.

[Expression 4]

$$g(x) = \frac{1}{2}\left(1 + erf\left(\frac{x-\beta}{\sqrt{2}\sigma}\right)\right) \quad (4)$$

In reception apparatus 400 illustrated in FIG. 10, inverse quantization section 401 performs the non-linear inverse quantization on the quantization data input from separation section 202 by use of the parameters (σ, β) input from control section 203. That is, inverse quantization section 401 performs a process that is opposite to the non-linear quantization process in quantization section 303 of transmission apparatus 300, and performs restoration of the IQ signal.

It is to be noted that quantization control information (σ, β) may be notified simultaneously with the quantization data, or may be preliminarily notified to reception apparatus 400 before the non-linear quantization/inverse quantization. In addition, transmission apparatus 300 may notify the quantization control information (updated σ or β) to reception apparatus 400 every time when standard deviation σ or correction coefficient β is updated.

Figure 13:
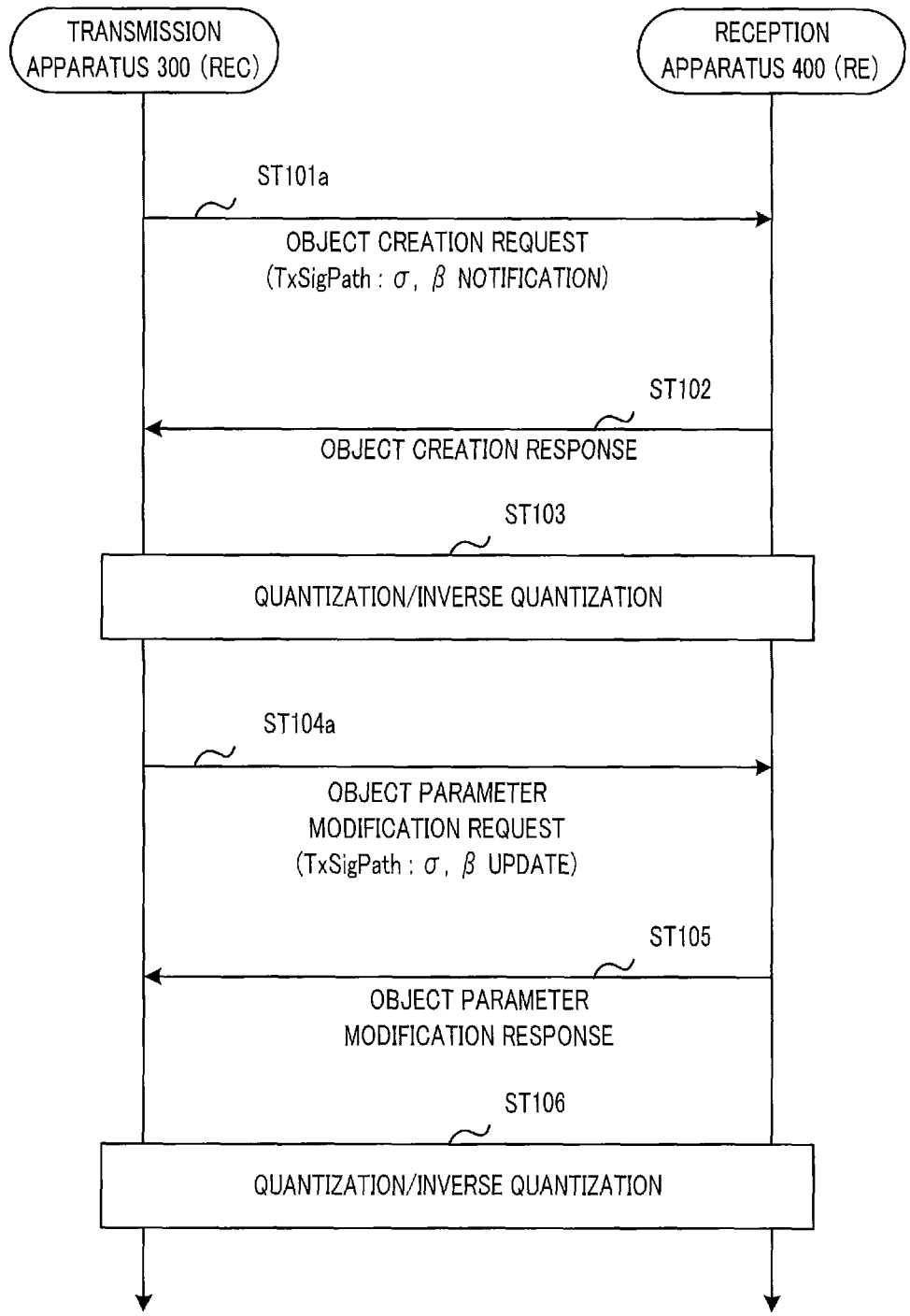
FIG. 13 is a sequence diagram illustrating a notification operation of correction coefficient α according to Embodiment 2.

FIG. 13 a sequence diagram illustrating an operation of exchanging signals of transmission apparatus 300 and reception apparatus 400. In FIG. 13, the operations identical to those of Embodiment 1 (FIG. 9) are denoted with the same reference numerals, and the description thereof will be omitted. To be more specific, this differs from Embodiment 1 (FIG. 9) only in that correction coefficient β is notified by use of the field represented by TxSigPath object at ST101*a* and 104*a* illustrated in FIG. 13. That is, correction coefficient β is notified to reception apparatus 400 as a parameter of TxSigPath object of C&M of ORI.

[Way of Setting Correction Coefficient β]

Next, details of the way of setting correction coefficient β used in the above-described transmission apparatus 300 and reception apparatus 400 are described.

As illustrated in FIG. 11, the amplitude distribution deflects to the positive side relative to the regular distribution as the degree of skewness of the amplitude distribution of the input signal increases, and the amplitude distribution deflects to the negative side relative to the regular distribution as the degree of skewness of the amplitude distribution of the input signal decreases.

On the other hand, as expressed in Expression (4), correction coefficient β is a parameter which is subtracted from input signal x as a molecule of error function (erf) corresponding to the cumulative distribution function of the regular distribution. That is, in the case of correction coefficient β>0, cumulative distribution function g(x) expressed by Expression (4) deflects to the positive side relative to the distribution of the cumulative distribution function g(x) expressed by Expression (1). In addition, in the case of correction coefficient β<0, the distribution in the cumulative distribution function g(x) expressed by Expression (4) deflects to the negative side relative to the distribution of the cumulative distribution function g(x) expressed by Expression (1).

That is, correction coefficient β serves to adjust the degree of the deviation of the distribution in cumulative distribution function g(x). In other words, correction coefficient β serves to shift the position of the quantization threshold in the non-linear quantization. To be more specific, the quantization threshold of the case of β=0 is shifted to the positive side as correction coefficient β increases in a range greater than 0, and the quantization threshold of the case of β=0 is shifted to the negative side as correction coefficient β decreases in a range of smaller than 0.

Figure 12:
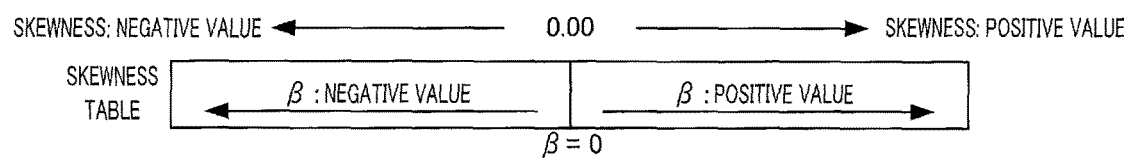
FIG. 12 illustrates an example skewness table according to Embodiment 2.

In view of this, as illustrated in FIG. 12, correction coefficient determination section 302 sets the value of correction coefficient β such that the value increases to the positive side as the degree of skewness of the amplitude distribution of the input signal increases to the positive side.

Figure 14:
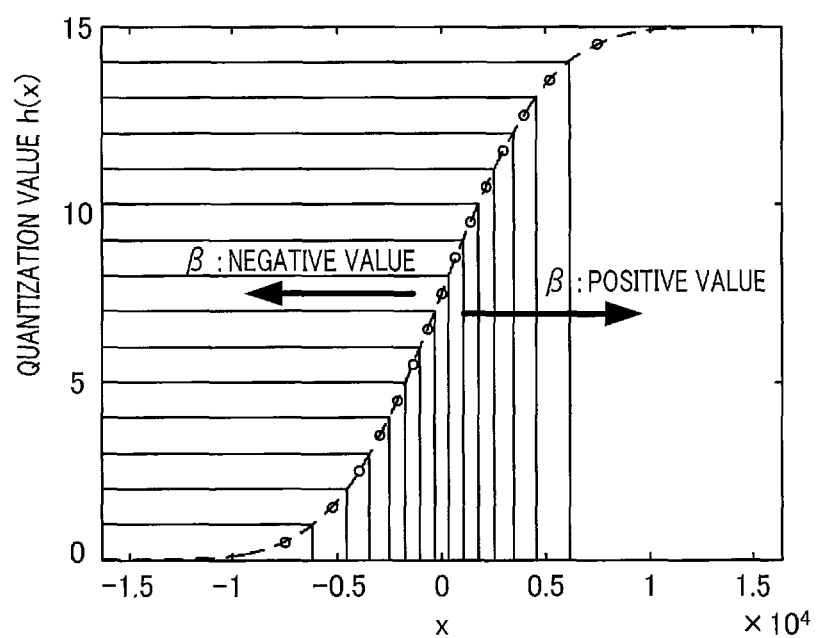
FIG. 14 is used for describing adjustment of a quantization zone with correction coefficient α according to Embodiment 2.

In this manner, as illustrated in FIG. 14, quantization section 303 performs non-linear quantization in which quantization threshold is shifted to the positive side.

On the other hand, as illustrated in FIG. 12, correction coefficient determination section 302 sets the value of correction coefficient β such that the value increases to the negative side as the degree of skewness of the amplitude distribution of the input signal increases to the negative side. In this manner, as illustrated in FIG. 14, quantization section 303 performs non-linear quantization in which quantization threshold is shifted to the negative side.

As described, transmission apparatus 300 appropriately adjusts the position of the quantization threshold in the non-linear quantization in accordance with the amplitude distribution of the input signal. In this manner, even in the case where the occurrence probability of the input signal varies, the non-linear quantization (non-linear inverse quantization) using the quantization threshold in accordance with the amplitude distribution of the input signal is performed, and thus quantization error can be reduced.

In the above-mentioned manner, in the present embodiment, transmission apparatus 300 determines correction coefficient β in accordance with the degree of skewness of the amplitude distribution of the IQ signal, and adjusts the position of the quantization threshold in the non-linear quantization. In this manner, the quantization threshold is appropriately set in accordance with variation of the amplitude distribution of the IQ signal, and thus the quantization error in the non-linear quantization can be reduced.

While the way of adjusting the quantization threshold and the representative value of each quantization zone with correction coefficient β has been described above, input signal x and the signal after the inverse quantization may be corrected with correction coefficient β.

(Embodiment 3)

In the present embodiment, non-linear quantization using both of the correction coefficient α described in Embodiment 1 and the correction coefficient β described in Embodiment 2 is described.

[Configuration of Communication System]

Figure 15:
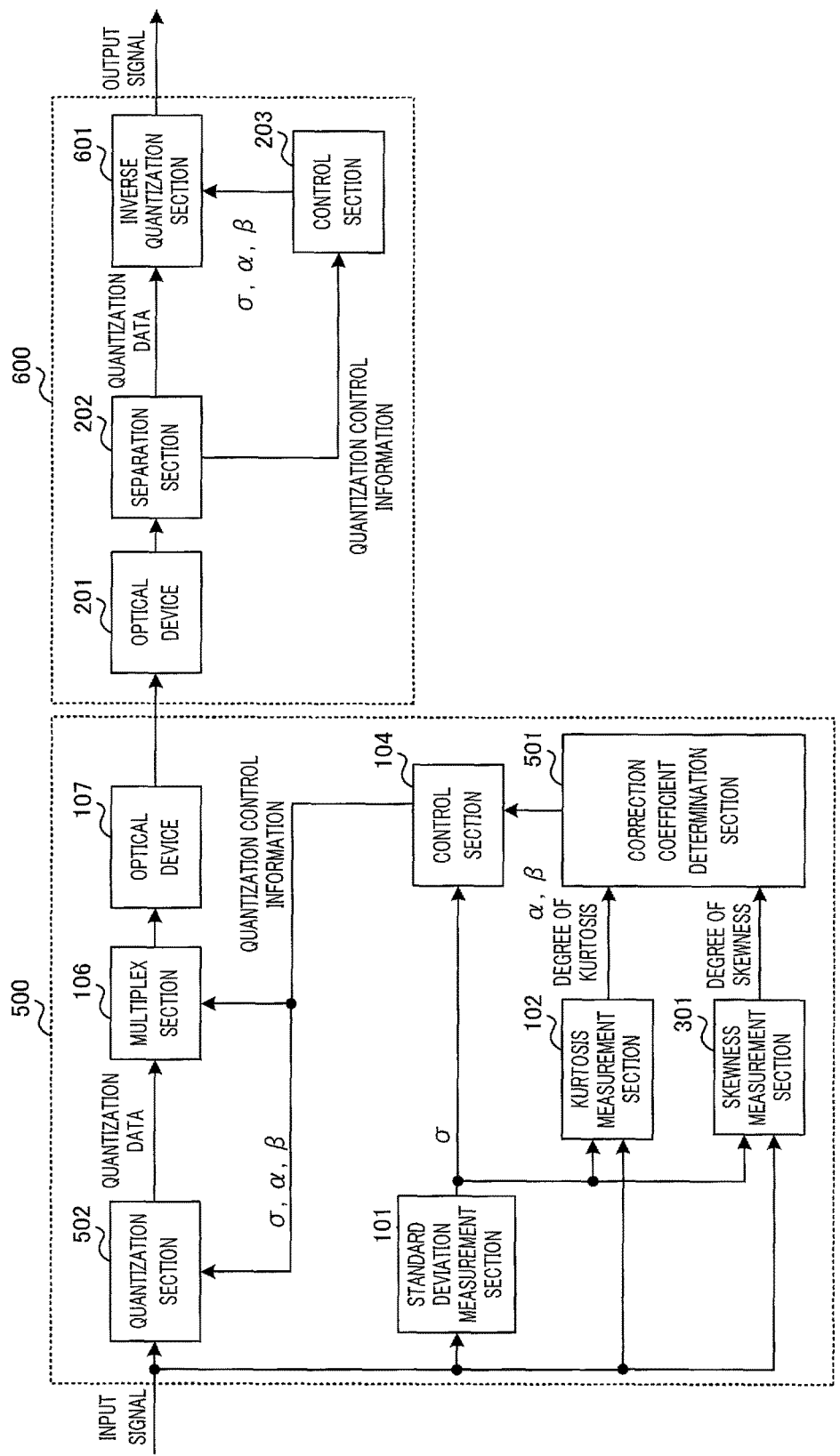
FIG. 15 is a block diagram illustrating an example configuration of a communication system according to Embodiment 3.

FIG. 15 illustrates an example configuration of a communication system according to the present embodiment.

Communication system 30 illustrated in FIG. 15 includes transmission apparatus 500 and reception apparatus 600. It is to be noted that, in FIG. 15, the components similar to those of Embodiment 1 (FIG. 2) and Embodiment 2 (FIG. 10) are denoted with the same reference numerals, and the description thereof will be omitted.

Correction coefficient determination section 501 of transmission apparatus 500 determines correction coefficient α of the cumulative distribution function used for the non-linear quantization in accordance with the degree of kurtosis indicated in information input from kurtosis measurement section 102, and determines correction coefficient β of the cumulative distribution function used for the non-linear quantization in accordance with the degree of skewness indicated in information input from skewness measurement section 301. Correction coefficient determination section 501 outputs the determined correction coefficients α and β to control section 104.

The quantization control information output from control section 104 includes standard deviation σ, and correction coefficients α and β.

Quantization section 502 performs the non-linear quantization on the input signal by use of the quantization control information (σ, α, β) input from control section 104, and calculates quantization data. To be more specific, quantization section 502 performs the non-linear quantization on the input signal in accordance with cumulative distribution function g(x) expressed by Expression (5) and Expression (2). Expression (5) differs from Expression (1) in that correction coefficients α and β are additionally provided.

[Expression 5]

$$g(x) = \frac{1}{2}\left(1 + erf\left(\frac{x - \beta}{\sqrt{2}\,\sigma * \alpha}\right)\right) \quad (5)$$

In reception apparatus 600 illustrated in FIG. 15, inverse quantization section 601 performs the non-linear inverse quantization on the quantization data input from separation section 202 by use of parameters (σ, α, β) input from control section 203. That is, inverse quantization section 601 performs a process that is opposite to the non-linear quantization process in quantization section 502 of transmission apparatus 500.

It is to be noted that the quantization control information (σ, α, β) may be notified simultaneously with the quantization data, or preliminarily notified to reception apparatus 600 before the non-linear quantization/inverse quantization. In addition, transmission apparatus 500 may notify the quantization control information (updated σ, α or β) to reception apparatus 600 every time when standard deviation σ, correction coefficient α or correction coefficient β is updated.

Figure 16:
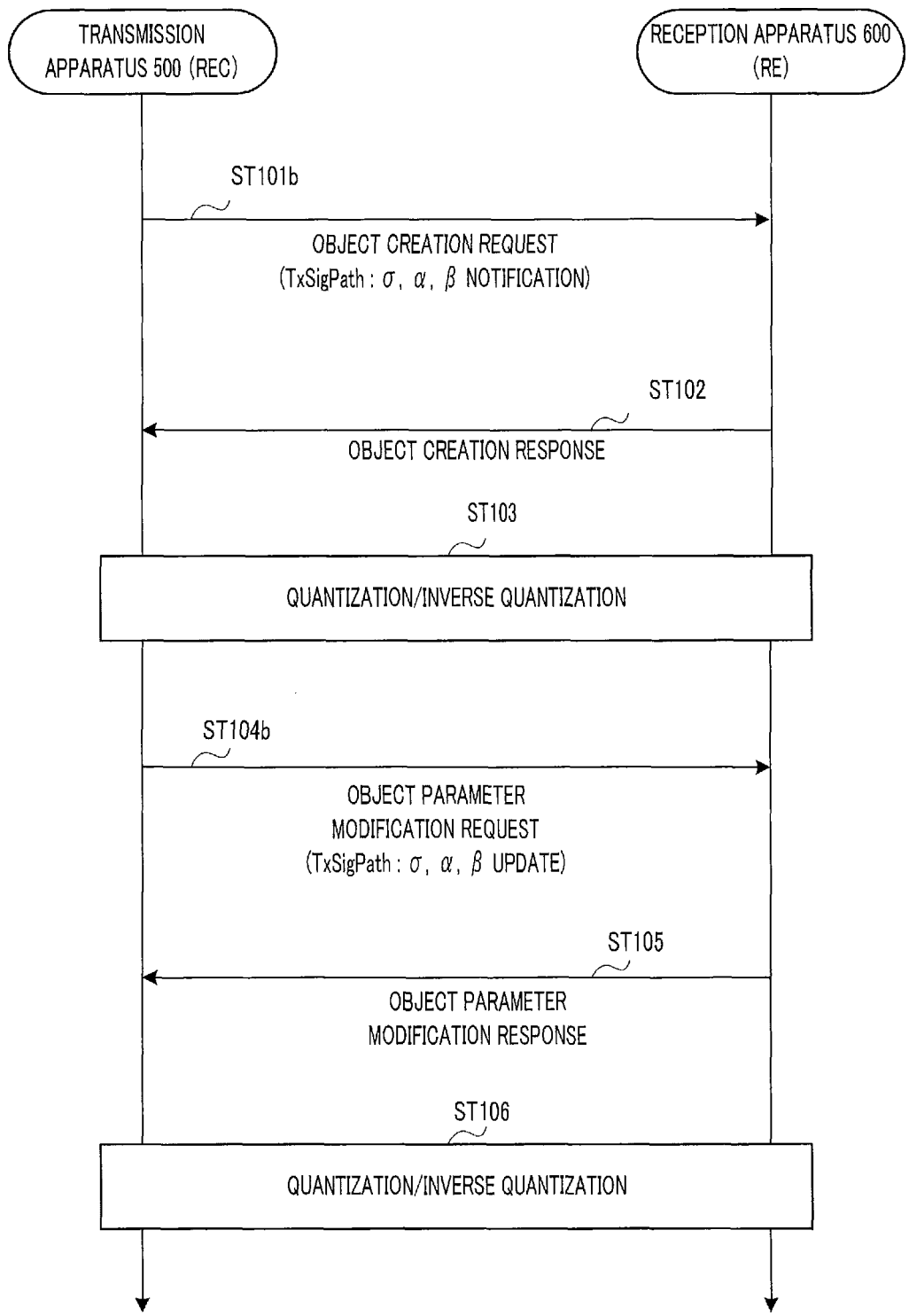
FIG. 16 is a sequence diagram illustrating a notification operation of correction coefficients α and β according to Embodiment 3.

FIG. 16 is a sequence diagram illustrating an operation of exchanging signals of transmission apparatus 500 and reception apparatus 600. In FIG. 16, the operations identical to those of Embodiment 1 (FIG. 9) and Embodiment 2 (FIG. 13) are denoted with the same reference numerals, and the description thereof will be omitted. To be more specific, at ST101b and 104b illustrated in FIG. 16, this is different from Embodiment 1 (FIG. 9) and Embodiment 2 (FIG. 13) only in that correction coefficients α and β are notified by use of the field represented by TxSigPath object. That is, correction coefficients α and β are notified to reception apparatus 600 as parameters of TxSigPath object of C&M of ORI.

In addition, as with Embodiment 1, transmission apparatus 500 may notify a result (σ'=σ*α) obtained by multiplying standard deviation σ by correction coefficient α to reception apparatus 600 instead of individually notifying standard deviation σ and correction coefficient α at ST101b or ST104b illustrated in FIG. 16. In this case, parameter σ' may be notified by use of the notification field corresponding to standard deviation σ of the existing notification field defined in C&M of ORI. With this configuration, it is unnecessary to newly define the notification field for correction coefficient α.

[Way of Setting Correction Coefficients α and β]

Next, details of the way of setting correction coefficients α and β used in transmission apparatus 500 and reception apparatus 600 are described.

As described in Embodiment 1, correction coefficient determination section 501 sets the value of correction coefficient α such that the value decreases relative to the reference value as the degree of kurtosis of the amplitude distribution of the input signal increases, and that the value increases relative to the reference value as the degree of kurtosis of the amplitude distribution of the input signal decreases (see, for example, FIG. 4).

In addition, as described in Embodiment 2, correction coefficient determination section 501 sets the value of correction coefficient β such that the value increases to the positive side as the degree of skewness of the amplitude distribution of the input signal increases to the positive side, and that the value increases to the negative side as the degree of skewness of the amplitude distribution of the input signal increases to the negative side (see, for example, FIG. 12).

Figure 17:
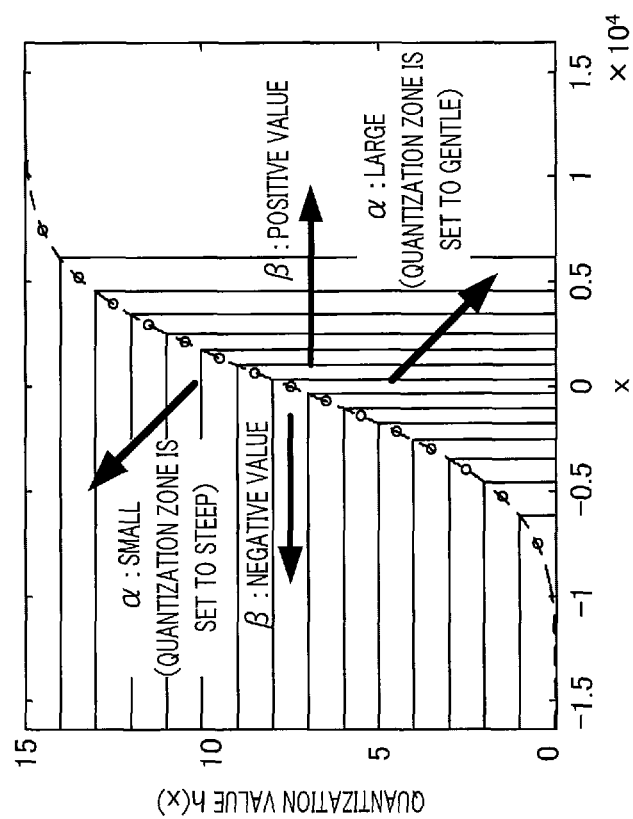
FIG. 17 is used for describing adjustment of a quantization zone with correction coefficients α and β according to Embodiment 3.

In this manner, as illustrated in FIG. 17, correction coefficient α in accordance with the degree of kurtosis of the amplitude distribution of the input signal is set, and quantization section 502 performs non-linear quantization in which the setting interval of the quantization threshold is adjusted. In addition, as illustrated in FIG. 17, correction coefficient β in accordance with the degree of skewness of the amplitude distribution of the input signal is set, and quantization section 502 performs non-linear quantization in which the position of the quantization threshold is adjusted.

That is, transmission apparatus 500 appropriately adjusts the interval and the position of the quantization threshold in the non-linear quantization in accordance with the degree of kurtosis and the degree of skewness of the amplitude distribution of the input signal. In this manner, even in the case where the occurrence probability of the input signal varies, non-linear quantization (non-linear inverse quantization) using the quantization threshold in accordance with the amplitude distribution of the input signal is performed, and thus quantization error can be reduced.

In the above-mentioned manner, in the present embodiment, transmission apparatus 500 determines correction coefficients α and β in accordance with the degree of kurtosis and the degree of skewness of the amplitude distribution of the IQ signal, and adjusts the interval and the position of the quantization threshold in the non-linear quantization. In this manner, the quantization threshold is appropriately set in accordance with the variation of the amplitude distribution of the IQ signal, and thus the quantization error in the non-linear quantization can be reduced.

While the way of adjusting the quantization threshold and the representative value of each quantization zone with correction coefficients α and β has been described above, input signal x and the signal after the inverse quantization may be corrected with correction coefficients α and β.

Hereinabove, the embodiments of the present invention have been described.

While the embodiments of the present invention is configured with a hardware in the embodiments, the embodiments of the present invention may also be achieved with a software in coordination with a hardware.

In addition, typically, the function blocks described in the embodiments are achieved as an integrated circuit, specifically, as an LSI. They may be individually configured as one chip, or may be configured as one chip including a part or whole of them. Depending on the difference in integration density, the LSI may be called an IC, a system LSI, a super LSI, or an ultra LSI.

In addition, the integrated circuit may not be configured with an LSI, and may be achieved with a dedicated circuit or a general-purpose processor. It is also possible to utilize an FPGA (Field Programmable Gate Array) which can be programed after manufacturing the LSI, or a reconfigurable processor in which setting or connection of circuit cells in the LSI can be reconfigured.

Furthermore, if there is other semiconductor techniques relating to integrated circuits which can replace LSIs, such techniques may be utilized for integration of the function blocks as a matter of course. Application of biotechnologies is highly possible.

This application is entitled to and claims the benefit of Japanese Patent Application No. 2015-046053 dated Mar. 9, 2015, the disclosure of which including the specification, drawings and abstract is incorporated herein by reference in its entirety.

INDUSTRIAL APPLICABILITY

The present invention is suitable for a mobile communication system.

REFERENCE SIGNS LIST 10, 20, 30 Communication system
100, 300, 500 Transmission apparatus
101 Standard deviation measurement section
102 Kurtosis measurement section
103, 302, 501 Correction coefficient determination section
104, 203 Control section
105, 303, 502 Quantization section
106 Multiplex section
107, 201 Optical device
200, 400, 600 Reception apparatus
202 Separation section
204, 401, 601 Inverse quantization section
301 Skewness measurement section

The invention claimed is:

1. A transmission apparatus comprising:
a kurtosis measurement section that measures a degree of kurtosis of an amplitude distribution of an input signal;
a determination section that determines correction coefficient α in accordance with the degree of kurtosis; and
a quantization section that quantizes the input signal and calculates quantization data by use of the correction coefficient α in accordance with Expression (1) and Expression (2)

[EXPRESSION 1]

$$g(x) = \frac{1}{2}\left(1 + erf\left(\frac{x}{\sqrt{2}\,\sigma * \alpha}\right)\right) \quad (1)$$

[EXPRESSION 2]

$$h(x) = \lceil g(x) * (2^M - 1) \rceil \quad (2)$$

where x represents the input signal and is an integer falling within a range of $[-2^{N-1} \ldots 2^{N-1}-1]$ (N is a natural number), σ represents a standard deviation of the amplitude distribution of the input signal, and h(x) represents the quantization data and is an integer falling within a range of $[0 \ldots 2^M-1]$ (M is a natural number smaller than N) wherein a right side of Expression (2) is a minimum integer of $g(x)*(2^M-1)$ or greater.

2. A transmission apparatus comprising:
a skewness measurement section that measures a degree of skewness of an amplitude distribution of an input signal;
a determination section that determines correction coefficient β in accordance with the degree of skewness; and
a quantization section that quantizes the input signal and calculates quantization data by use of the correction coefficient β in accordance with Expression (1) and Expression (2)

[EXPRESSION 1]

$$g(x) = \frac{1}{2}\left(1 + erf\left(\frac{x-\beta}{\sqrt{2}\,\sigma}\right)\right) \quad (1)$$

[EXPRESSION 2]

$$h(x) = \lceil g(x) * (2^M - 1) \rceil \quad (2)$$

where x represents the input signal and is an integer falling within a range of $[-2^{N-1} \ldots 2^{N-1}-1]$ (N is a natural number), σ represents a standard deviation of the amplitude distribution of the input signal, and h(x) represents the quantization data and is an integer falling within a range of $[0 \ldots 2^M-1]$ (M is a natural number smaller than N) wherein a right side of Expression (2) is a minimum integer of $g(x)*(2^M-1)$ or greater.

3. A transmission apparatus comprising:
a kurtosis measurement section that measures a degree of kurtosis of an amplitude distribution of an input signal;
a skewness measurement section that measures a degree of skewness of the amplitude distribution of the input signal;
a determination section that determines correction coefficient α in accordance with the degree of kurtosis and determines correction coefficient β in accordance with the degree of skewness; and
a quantization section that quantizes the input signal and calculates quantization data by use of the correction coefficient α and the correction coefficient β in accordance with Expression (1) and Expression (2)

[EXPRESSION 1]

$$g(x) = \frac{1}{2}\left(1 + erf\left(\frac{x}{\sqrt{2}\,\sigma*\alpha}\right)\right) \quad (1)$$

[EXPRESSION 2]

$$h(x) = \lceil g(x) * (2^M - 1) \rceil \quad (2)$$

where x represents the input signal and is an integer falling within a range of $[-2^{N-1} \ldots 2^{N-1}-1]$ (N is a natural number), σ represents a standard deviation of the amplitude distribution of the input signal, and h(x) represents the quantization data and is an integer falling within a range of $[0 \ldots 2^M-1]$ (M is a natural number smaller than N) wherein a right side of Expression (2) is a minimum integer of $g(x)*(2^M-1)$ or greater.

4. The transmission apparatus according to claim 1 wherein the determination section sets the correction coefficient α such that the correction coefficient α decreases as the degree of kurtosis increases to a positive side, and that the correction coefficient α increases as the degree of kurtosis increases to a negative side.

5. The transmission apparatus according to claim 2 wherein the determination section sets the correction coefficient β such that the correction coefficient β increases to a positive side as the degree of skewness increases to the positive side, and that the correction coefficient β decreases to a negative side as the degree of skewness increases to the negative side.

6. The transmission apparatus according to claim 1 wherein the correction coefficient α is notified to a reception apparatus as a TxSigPath object parameter of C&M of ORI.

7. The transmission apparatus according to claim 6 wherein a result (σ*α) obtained by multiplying the standard deviation σ by the correction coefficient α is notified by a field corresponding to the standard deviation σ of a field of TxSigPath object of C&M of ORI.

8. The transmission apparatus according to claim 2 wherein the correction coefficient β is notified to a reception apparatus as a TxSigPath object parameter of C&M of ORI.

9. A quantization method comprising:
measuring a degree of kurtosis of an amplitude distribution of an input signal;
determining correction coefficient α in accordance with the degree of kurtosis; and
quantizing the input signal and calculating quantization data by use of the correction coefficient α in accordance with Expression (1) and Expression (2)

[EXPRESSION 1]

$$g(x) = \frac{1}{2}\left(1 + erf\left(\frac{x}{\sqrt{2}\,\sigma*\alpha}\right)\right) \quad (1)$$

[EXPRESSION 2]

$$h(x) = \lceil g(x) * (2^M - 1) \rceil \quad (2)$$

where x represents the input signal and is an integer falling within a range of $[-2^{N-1} \ldots 2^{N-1}-1]$ (N is a natural number), σ represents a standard deviation of the amplitude distribution of the input signal, and h(x) represents the quantization data and is an integer falling within a range of $[0 \ldots 2^M-1]$ (M is a natural number smaller than N) wherein a right side of Expression (2) is a minimum integer of $g(x)*(2^M-1)$ or greater.

10. A quantization method comprising:
measuring a degree of skewness of an amplitude distribution of an input signal;
determining correction coefficient β in accordance with the degree of skewness; and
quantizing the input signal and calculating quantization data by use of the correction coefficient β in accordance with Expression (1) and Expression (2)

[EXPRESSION 1]

$$g(x) = \frac{1}{2}\left(1 + erf\left(\frac{x-\beta}{\sqrt{2}\,\sigma}\right)\right) \quad (1)$$

[EXPRESSION 2]

$$h(x) = \lceil g(x) * (2^M - 1) \rceil \quad (2)$$

where x represents the input signal and is an integer falling within a range of $[-2^{N-1} \ldots 2^{N-1}-1]$ (N is a natural number), σ represents a standard deviation of the amplitude distribution of the input signal, and h(x) represents the quantization data and is an integer falling within a range of $[0 \ldots 2^M-1]$ (M is a natural number smaller than N) wherein a right side of Expression (2) is a minimum integer of $g(x)*(2^M-1)$ or greater.

11. A quantization method comprising:
measuring a degree of kurtosis of an amplitude distribution of an input signal;
measuring a degree of skewness of the amplitude distribution of the input signal;

determining correction coefficient α in accordance with the degree of kurtosis and determining correction coefficient β in accordance with the degree of skewness; and quantizing the input signal and calculating quantization data by use of the correction coefficient α and the correction coefficient β in accordance with Expression (1) and Expression (2)

[EXPRESSION 1]

$$g(x) = \frac{1}{2}\left(1 + erf\left(\frac{x}{\sqrt{2}\,\sigma*\alpha}\right)\right) \quad (1)$$

[EXPRESSION 2]

$$h(x) = \lceil g(x)*(2^M - 1) \rceil \quad (2)$$

where x represents the input signal and is an integer falling within a range of $[-2^{N-1} \ldots 2^{N-1}-1]$ (N is a natural number), σ represents a standard deviation of the amplitude distribution of the input signal, and h(x) represents the quantization data and is an integer falling within a range of $[0 \ldots 2^M-1]$ (M is a natural number smaller than N) wherein a right side of Expression (2) is a minimum integer of $g(x)*(2^M-1)$ or greater.

12. The transmission apparatus according to claim 3 wherein the determination section sets the correction coefficient α such that the correction coefficient α decreases as the degree of kurtosis increases to a positive side, and that the correction coefficient α increases as the degree of kurtosis increases to a negative side.

13. The transmission apparatus according to claim 3 wherein the determination section sets the correction coefficient β such that the correction coefficient β increases to a positive side as the degree of skewness increases to the positive side, and that the correction coefficient β decreases to a negative side as the degree of skewness increases to the negative side.

14. The transmission apparatus according to claim 3 wherein the correction coefficient α is notified to a reception apparatus as a TxSigPath object parameter of C&M of ORI.

15. The transmission apparatus according to claim 14 wherein a result (σ*α) obtained by multiplying the standard deviation σ by the correction coefficient α is notified by a field corresponding to the standard deviation σ of a field of TxSigPath object of C&M of ORI.

16. The transmission apparatus according to claim 3 wherein the correction coefficient β is notified to a reception apparatus as a TxSigPath object parameter of C&M of ORI.

* * * * *